US012740426B2

(12) United States Patent
Lee et al.

(10) Patent No.: US 12,740,426 B2
(45) Date of Patent: Sep. 15, 2026

(54) SEMICONDUCTOR DEVICE AND METHOD OF FORMING AIP STRUCTURE TO REDUCE SIGNAL INTERFERENCE AMONG AND BETWEEN ENCAPSULANT BLOCKS

(71) Applicant: JCET STATS ChipPAC Korea Limited, Incheon (KR)

(72) Inventors: SeungHyun Lee, Incheon (KR); YeJin Park, Incheon (KR); HeeSoo Lee, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 365 days.

(21) Appl. No.: 18/462,204

(22) Filed: Sep. 6, 2023

(65) Prior Publication Data

US 2025/0079350 A1 Mar. 6, 2025

(51) Int. Cl.

| | |
|---|---|
| ***H10W 44/20*** | (2026.01) |
| ***H01Q 1/22*** | (2006.01) |
| ***H10W 42/20*** | (2026.01) |
| ***H10W 74/01*** | (2026.01) |
| ***H10W 74/10*** | (2026.01) |
| ***H10W 90/00*** | (2026.01) |

(52) U.S. Cl.

CPC .......... *H10W 44/20* (2026.01); *H01Q 1/2283* (2013.01); *H10W 42/20* (2026.01); *H10W 74/016* (2026.01); *H10W 74/117* (2026.01); *H10W 44/248* (2026.01); *H10W 90/724* (2026.01)

(58) Field of Classification Search

CPC ............. H01L 2223/6677; H01L 23/66; H01L 21/565; H01L 23/552; H01L 2924/3025; H01L 2224/16225; H01Q 1/2283; H01Q 1/38; H01Q 17/00; H01Q 1/52; H10W 44/248; H10W 44/20; H10W 74/016; H10W 90/724; H10W 42/20; H10W 74/117

USPC .......................................................... 257/659

See application file for complete search history.

(56) References Cited

U.S. PATENT DOCUMENTS

| | | | | |
|---|---|---|---|---|
| 2021/0280959 A1* | 9/2021 | Han | .................... | H01L 23/3121 |
| 2021/0313694 A1* | 10/2021 | Lim | ..................... | H01Q 1/2283 |
| 2021/0366838 A1* | 11/2021 | Han | ................. | H01L 23/49838 |

(Continued)

*Primary Examiner* — Didarul A Mazumder

(74) *Attorney, Agent, or Firm* — Robert D. Atkins; PATENT LAW GROUP

(57) ABSTRACT

A semiconductor device has a substrate and an electrical component disposed over a first surface of the substrate. An antenna is disposed over a second surface of the substrate. An absorbing material is disposed over the second surface of the substrate around the antenna. The absorbing material is thin and flexible to be workable over the second surface of the substrate. The absorbing material has a plurality of openings to accommodate the antenna and the antenna extends above the absorbing material. A first encapsulant can be deposited over the antenna and second surface of the substrate prior to the absorbing material. A second encapsulant is deposited over the electrical component. A shielding material is disposed over the encapsulant and electrical component. An electrical connector is disposed over the first surface of the substrate. The substrate, electrical component, first encapsulant, second encapsulant, shielding material, and electrical connector constitute an antenna-on-package.

23 Claims, 15 Drawing Sheets

(56) References Cited

U.S. PATENT DOCUMENTS

| | | | | |
|---|---|---|---|---|
| 2021/0398923 | A1* | 12/2021 | Kang | H01L 21/565 |
| 2022/0051996 | A1* | 2/2022 | Lee | H01Q 1/2283 |
| 2022/0263221 | A1* | 8/2022 | Ke | H01Q 1/2283 |
| 2023/0067475 | A1* | 3/2023 | Cho | H01L 23/66 |
| 2023/0140748 | A1* | 5/2023 | Lee | H05K 1/0218<br>361/761 |
| 2023/0187374 | A1* | 6/2023 | Jian | H01L 21/561<br>257/224 |
| 2023/0268295 | A1* | 8/2023 | Chen | H01L 23/66<br>257/728 |

* cited by examiner 170
200
176
180
198
172
134
130c
136
180
200
180
130b
200
172
180
110
172
104
112
130a
202
200
196
192
194
206
188

SEMICONDUCTOR DEVICE AND METHOD OF FORMING AIP STRUCTURE TO REDUCE SIGNAL INTERFERENCE AMONG AND BETWEEN ENCAPSULANT BLOCKS

FIELD OF THE INVENTION

The present invention relates in general to semiconductor devices and, more particularly, to a semiconductor device and method of forming an antenna-in-package (AiP) with reduced interference among and between encapsulant blocks.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into a system-in-package (SiP) module for higher density in a small space and extended electrical functionality. Within the SiP module, semiconductor die and IPDs are disposed on a first surface of a substrate for structural support and electrical interconnect. An encapsulant is deposited over the semiconductor die, IPDs, and substrate. An electrical connector is disposed on the first surface of the substrate for electrical communication between the electrical components and external devices.

The SiP module includes high speed digital and RF electrical components, highly integrated for small size and low height, and operating at high clock frequencies. An electromagnetic shielding material is commonly conformally applied over the encapsulant. The electromagnetic shielding layer reduces or inhibits EMI, RFI, and other inter-device interference, for example as radiated by high-speed digital devices, from affecting neighboring devices within or adjacent to SiP module.

An antenna can be disposed on a second surface of the substrate to provide wireless communication for the SiP module. With the addition of the antenna, the SiP constitutes an AiP. The signal radiation from the antenna is emitted in many directions. AiP can emit radiation in the microwave frequency range, conduct surface currents, and exhibit surface reflections in a cavity resonance. The signal radiation from the antenna, particularly adjacent antenna areas, can interfere with each other causing overall degradation in the transmitted signal.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
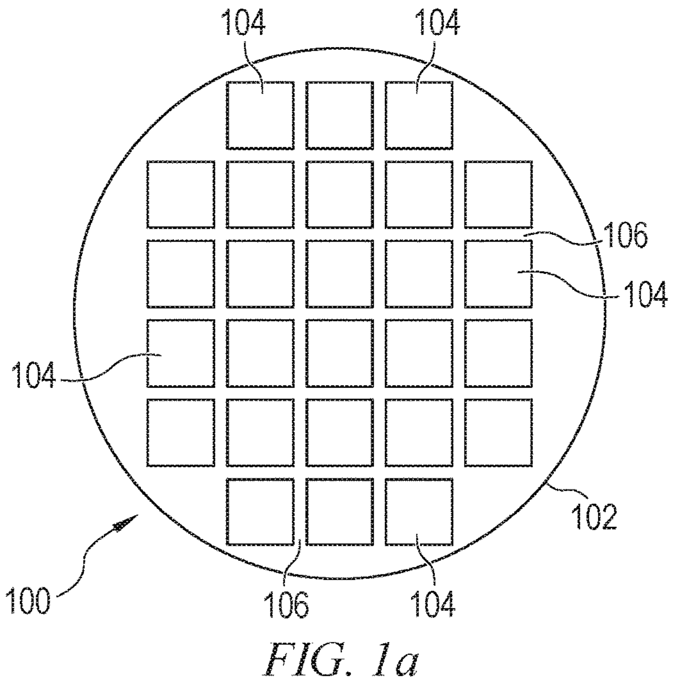
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Semiconductor die 104 can process RF signals transmitted and received through an antenna.

Figure 1B:
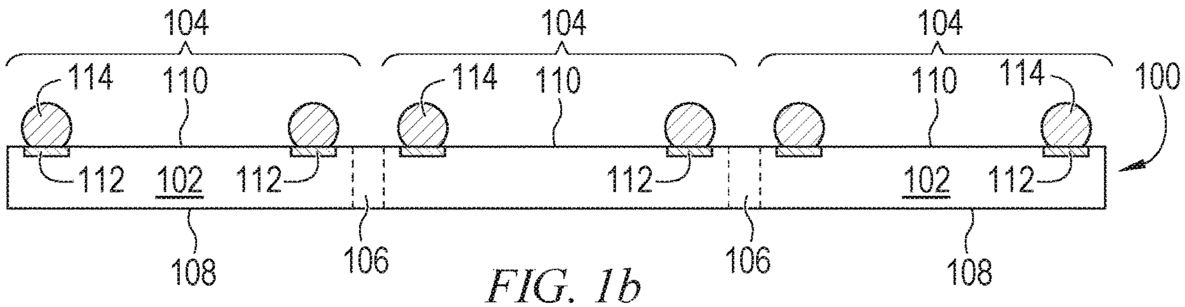

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
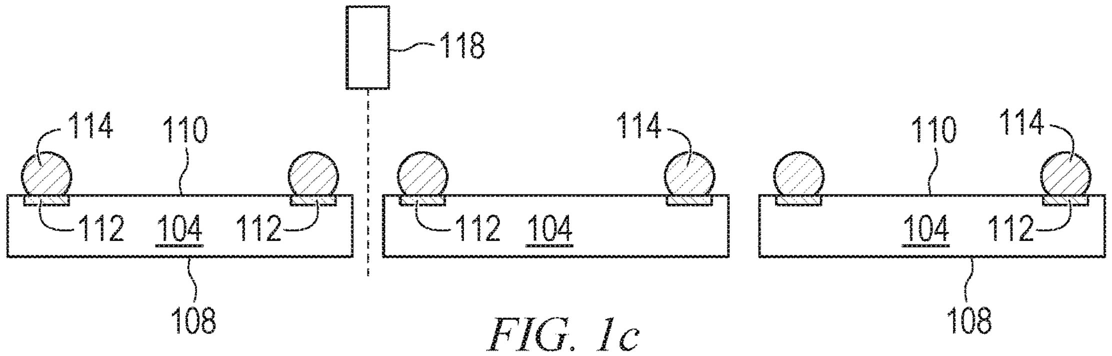

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
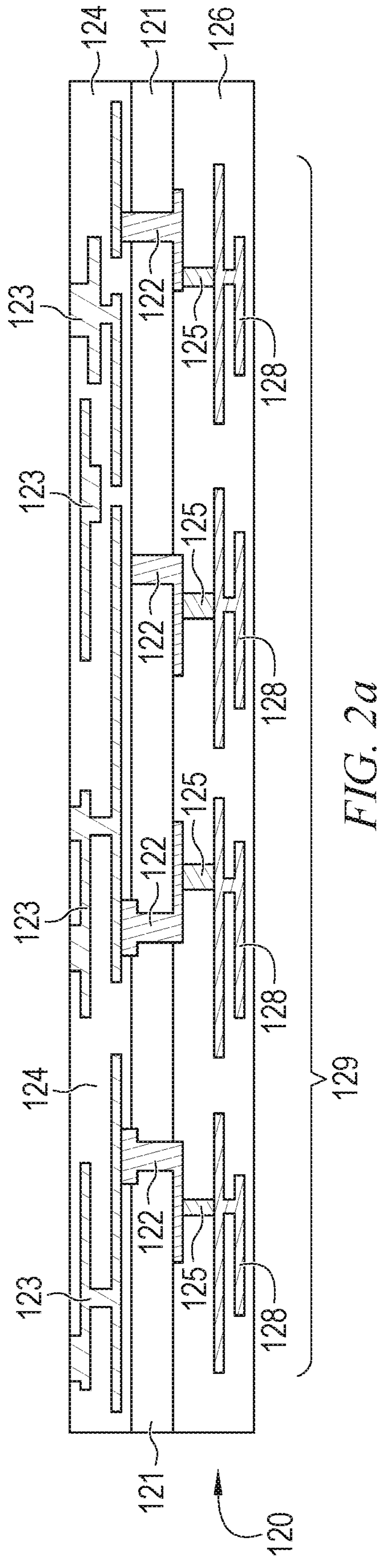
FIGS. 2*a*-2*n* illustrate a process of forming an AiP module with absorbing material disposed over the AiP module.
Figure 2B:
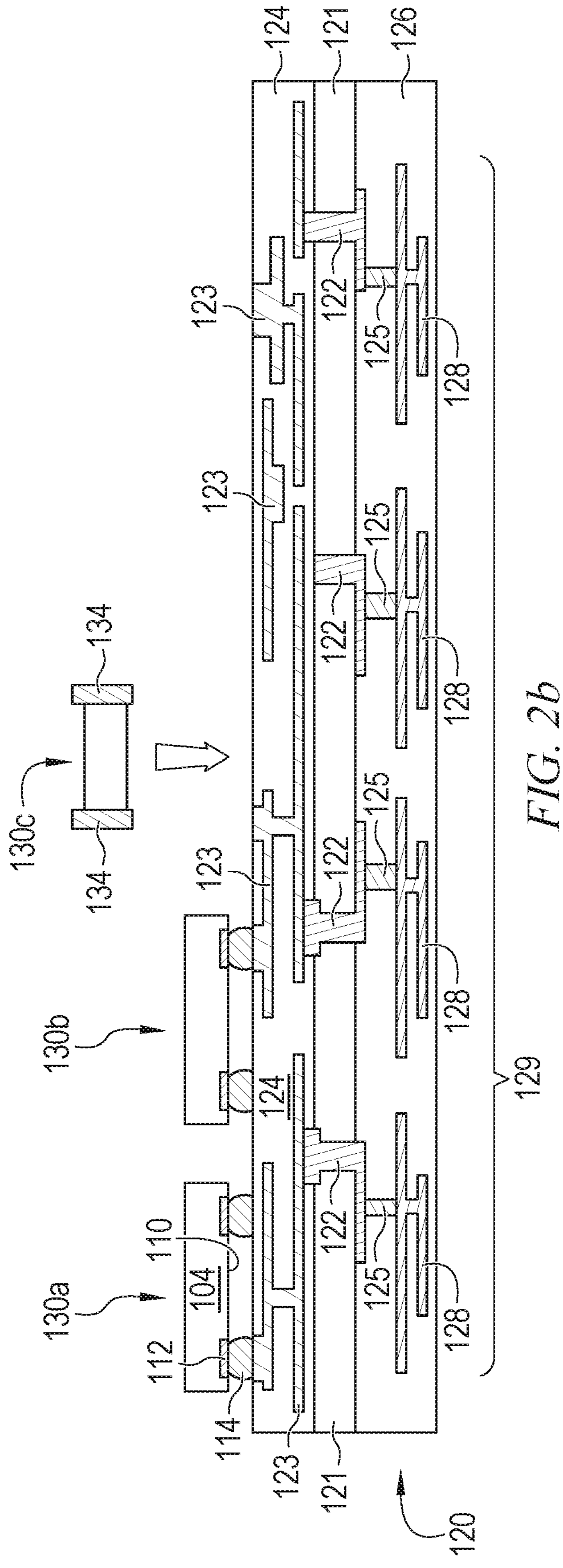
Figure 2C:
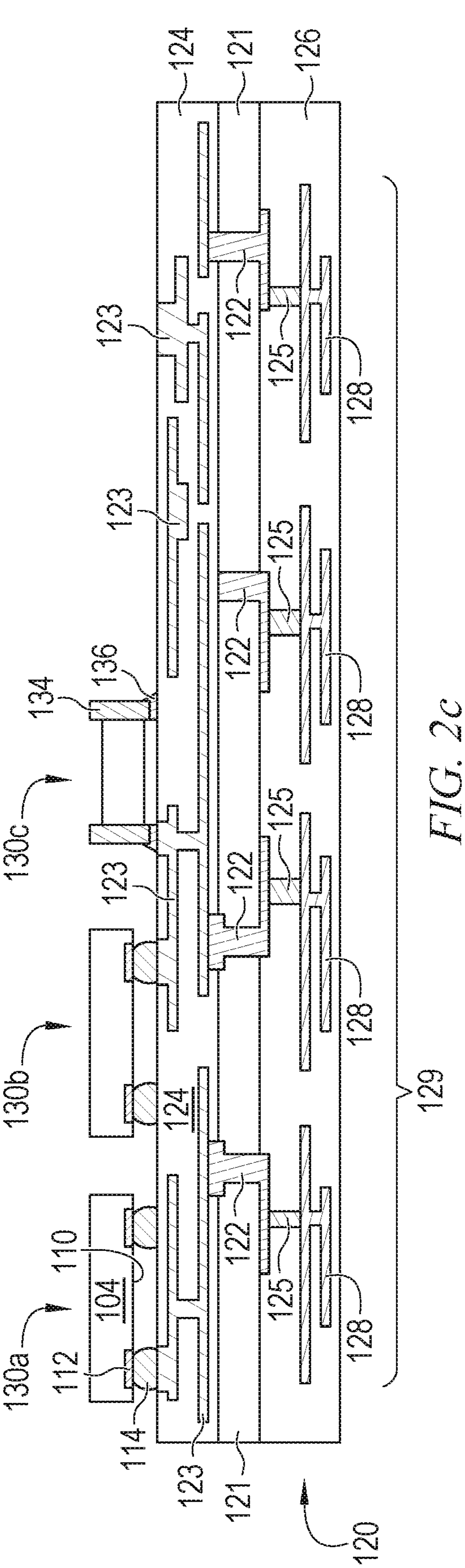
Figure 2D:
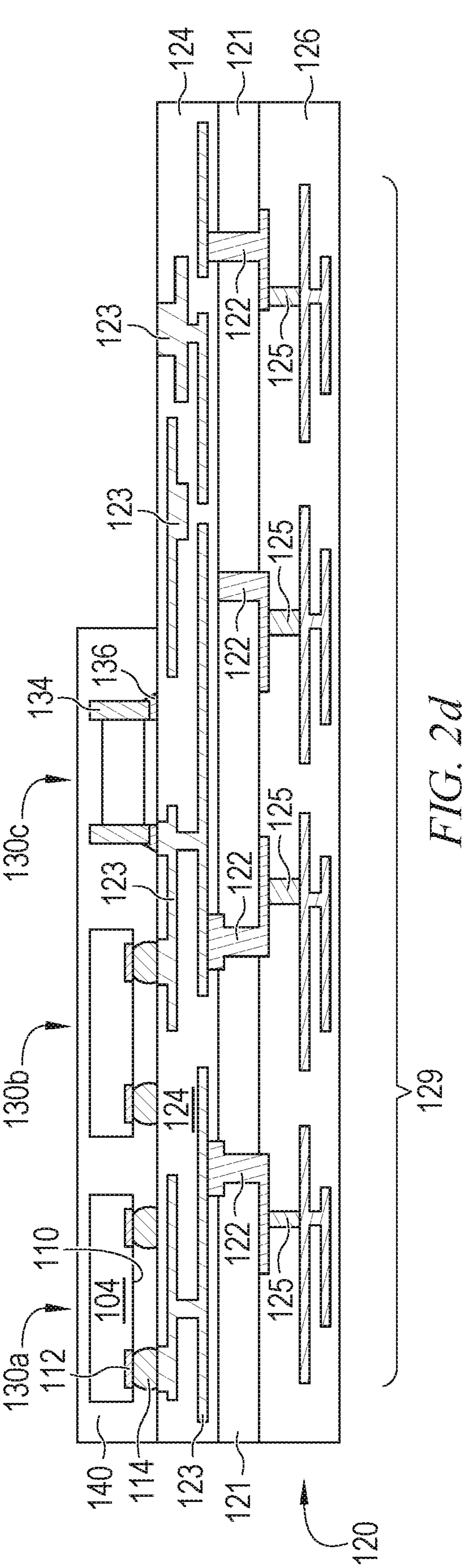
Figure 2E:
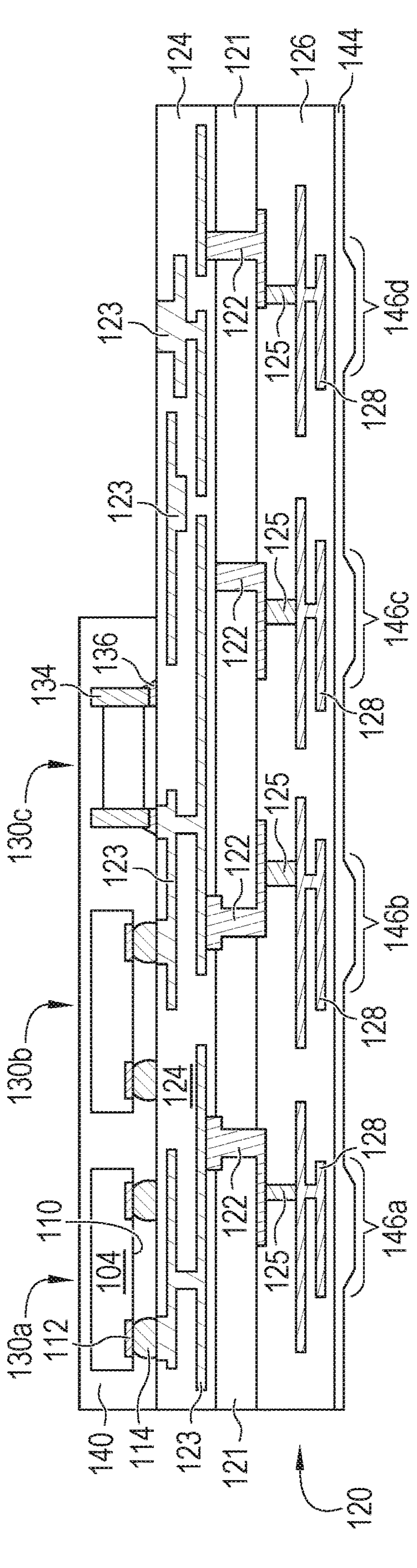
Figure 2F:
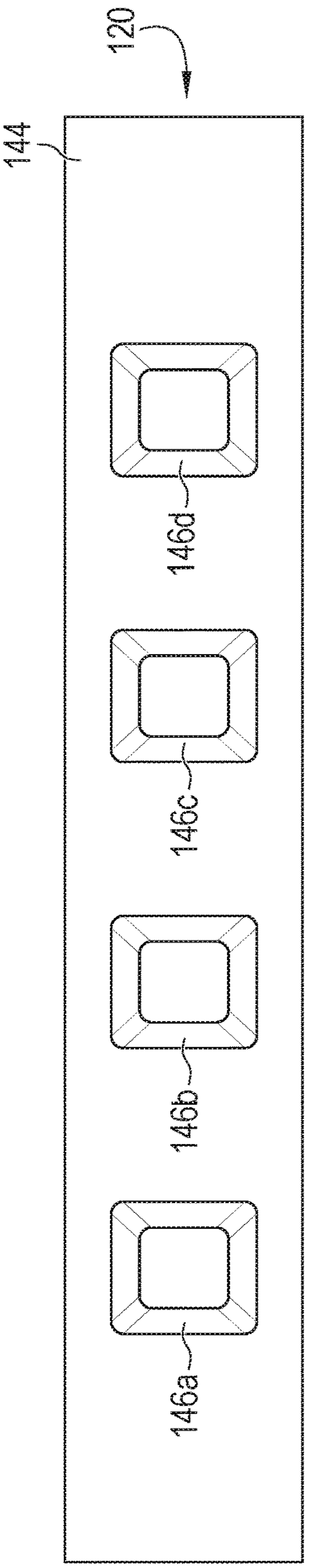
Figure 2G:
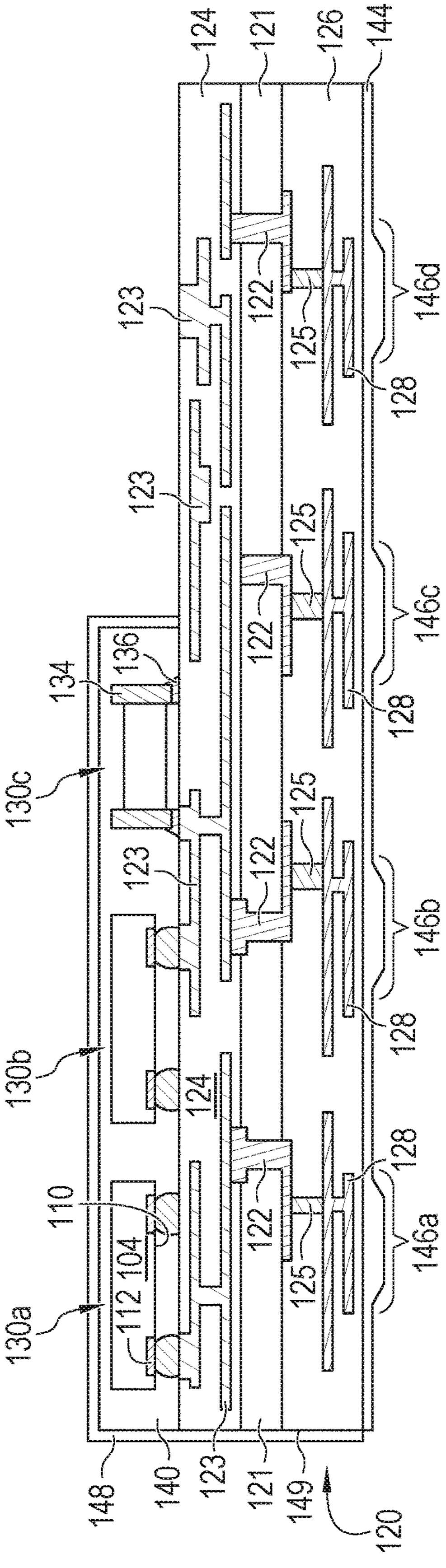
Figure 2H:
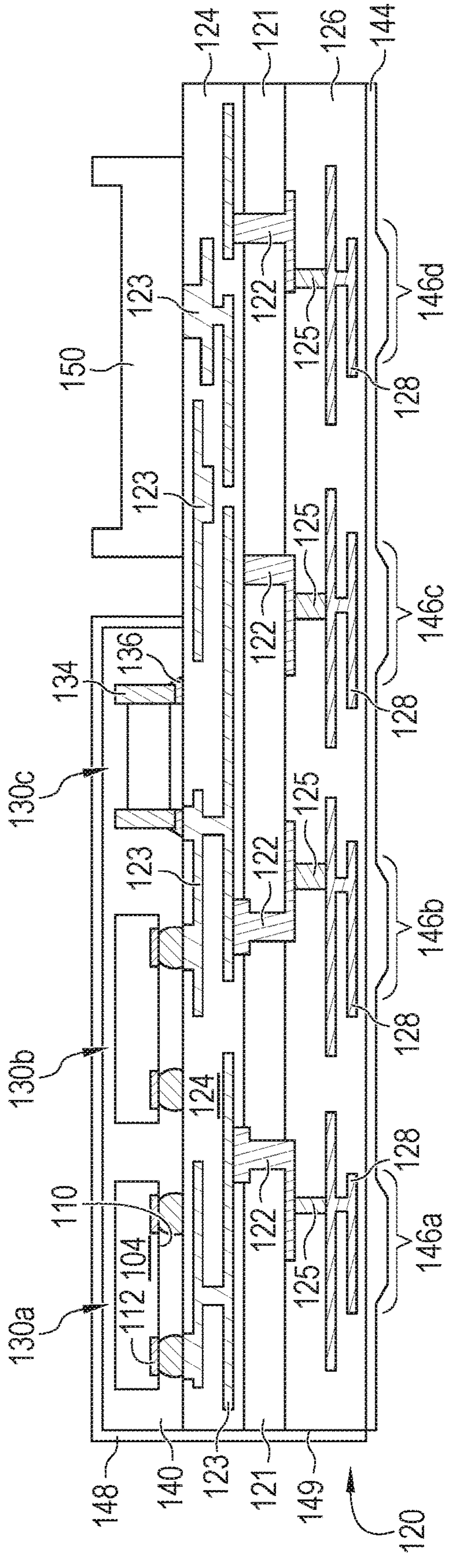
Figure 2I:
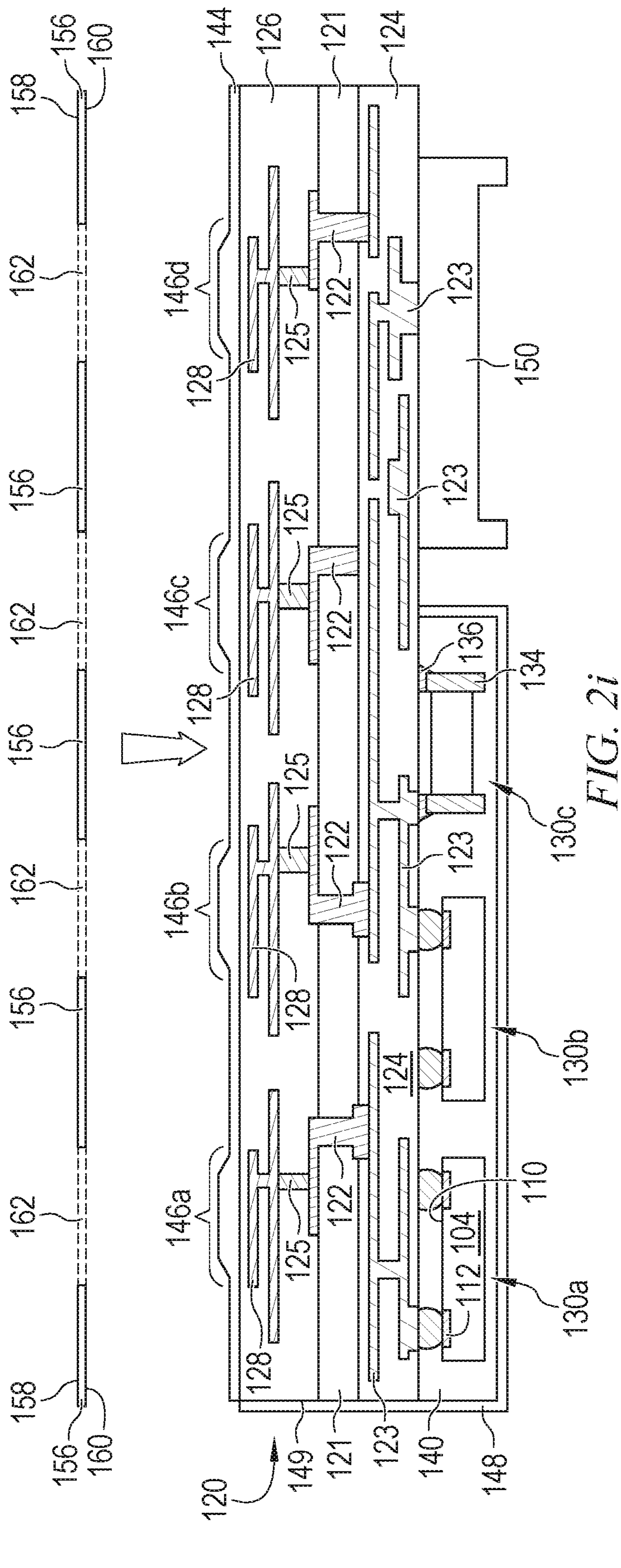
Figure 2J:
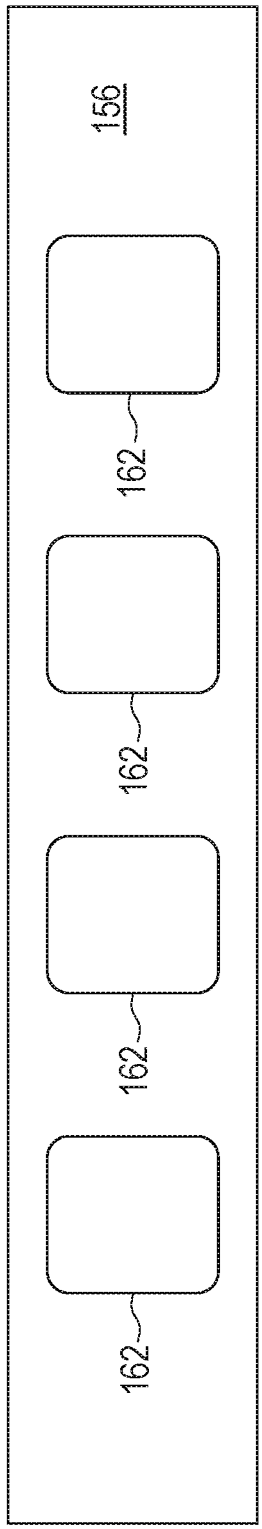
Figure 2K:
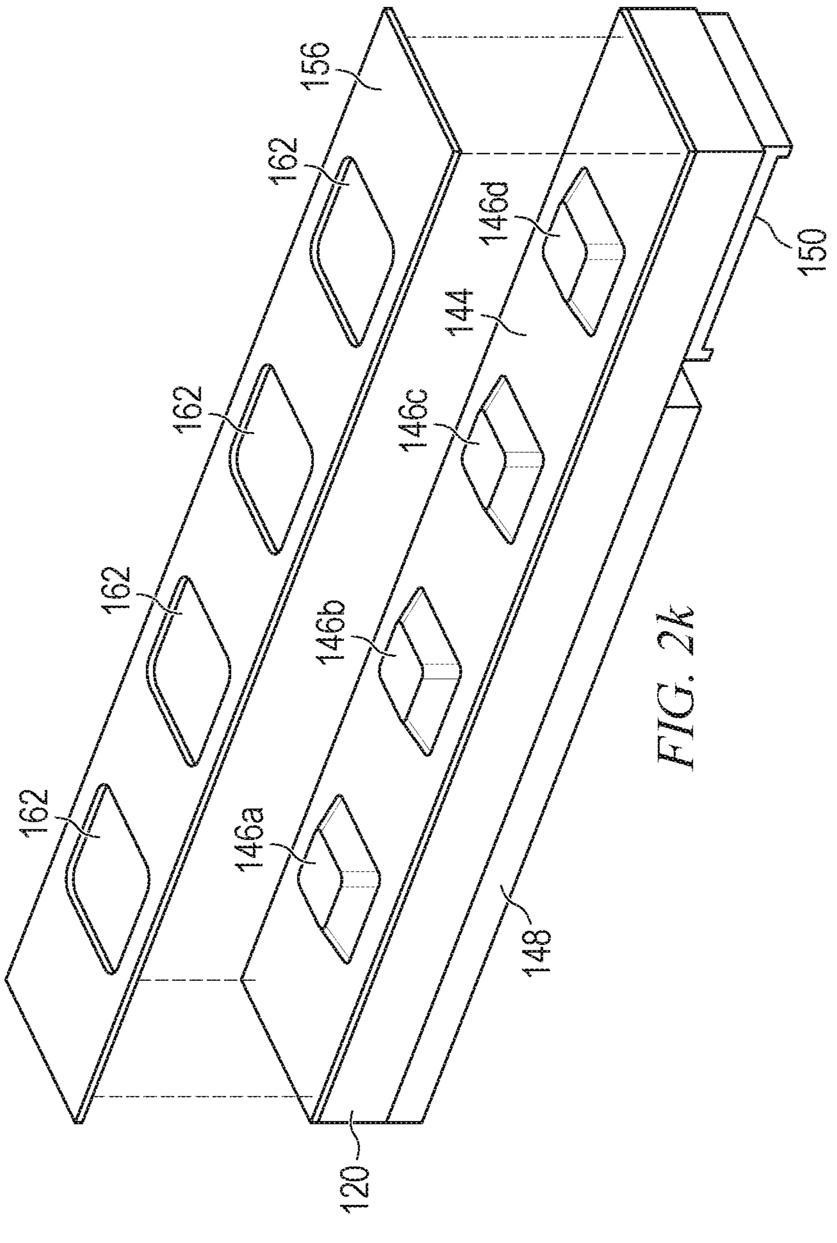
Figure 2L:
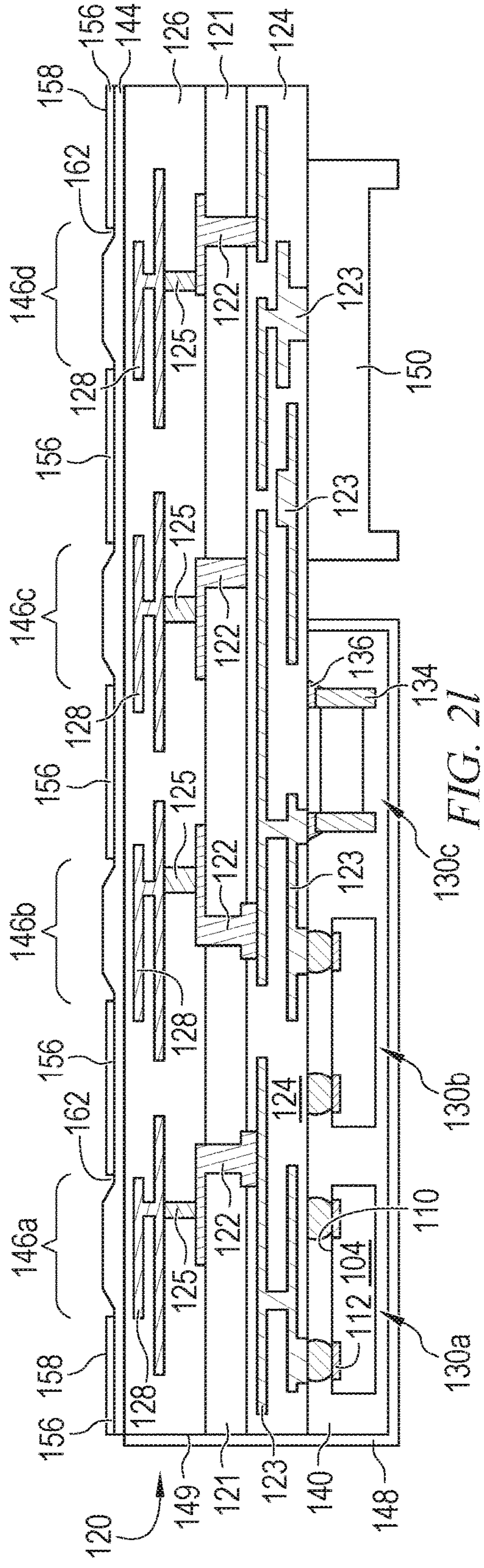
Figure 2M:
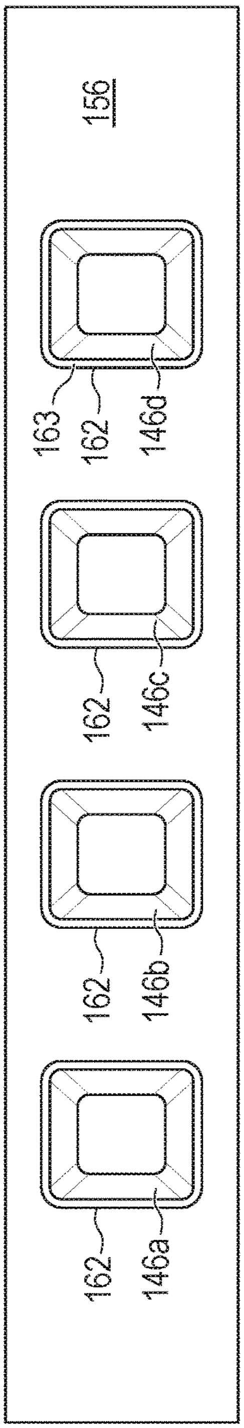
Figure 2N:
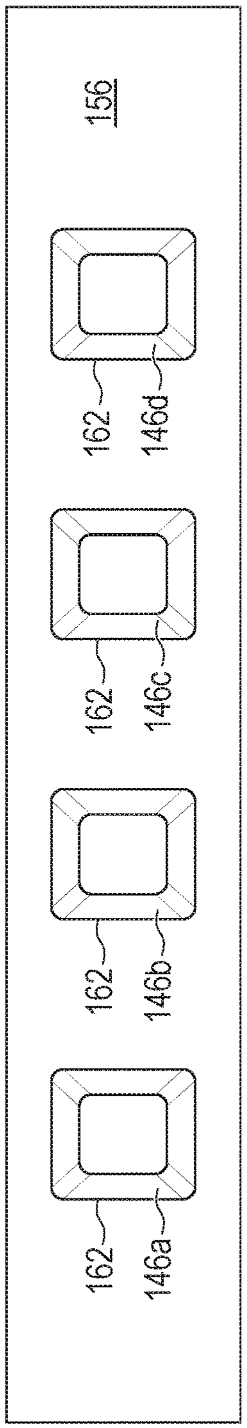

FIGS. 2*a*-2*n* illustrate a process of disposing electrical components and electrical connector over an interconnect substrate to form an AiP module with absorbing material disposed over the AiP module. FIG. 2*a* shows a cross-sectional view of interconnect and antenna substrate 120 including core material 121, such as silicon, germanium, aluminum phosphide, aluminum arsenide, gallium arsenide, gallium nitride, indium phosphide, silicon carbide, or other bulk material for structural support. Alternatively, core material can be a multi-layer flexible laminate, ceramic, copper clad laminate (CCL), glass, or epoxy molding compound. Core material 121 may contain one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Conductive vias 122 are formed through core material 121. Conductive layers 123 and insulating layers 124 are formed over core material 121. Conductive layers 123 can be one or more layers of Al, Cu, Sn, Ni, Au, Ag, or other suitable electrically conductive material. Conductive layers 123 can be formed using PVD, CVD, electrolytic plating, electroless plating process, or other suitable metal deposition process. Conductive layer 123 provides horizontal electrical interconnect across substrate 120 and vertical electrical interconnect through substrate 120. Portions of conductive layers 123 can be electrically common or electrically isolated depending on the design and function of semiconductor die 104 and other electrical components. Insulating layers 124 contains one or more layers of SiO2, Si3N4, SiON, Ta205, Al2O3, solder resist, polyimide, BCB, PBO, and other material having similar insulating and structural properties. Insulating layers 124 can be formed using PVD, CVD, printing, lamination, spin coating, spray coating, sintering or thermal oxidation. Insulating layers 124 provide isolation between conductive layers 123. There can be multiple conductive layers like 123 separated by multiple insulating layers like 124.

Conductive layers 125 and insulating layers 126 are formed over core material 121 opposite conductive layers 123 and insulating layers 124. Conductive layers 125 can be one or more layers of Al, Cu, Sn, Ni, Au, Ag, or other suitable electrically conductive material. Conductive layers 125 can be formed using PVD, CVD, electrolytic plating, electroless plating process, or other suitable metal deposition process. Conductive layer 125 provides horizontal electrical interconnect across substrate 120 and vertical electrical interconnect through substrate 120. Portions of conductive layers 125 can be electrically common or electrically isolated depending on the design and function of semiconductor die 104 and other electrical components. Insulating layers 126 contains one or more layers of SiO2, Si3N4, SiON, Ta2O5, Al2O3, solder resist, polyimide, BCB, PBO, and other material having similar insulating and structural properties. Insulating layers 126 can be formed using PVD, CVD, printing, lamination, spin coating, spray coating, sintering or thermal oxidation. Insulating layers 126 provide isolation between conductive layers 125. There can be multiple conductive layers like 125 separated by multiple insulating layers like 126.

A conductive layer 128 is also formed within insulating layers 126 using PVD, CVD, electrolytic plating, electroless plating process, or other suitable metal deposition process. Conductive layer 128 can be one or more layers of Al, Cu, Sn, Ni, Au, Ag, or other suitable electrically conductive material. Conductive layer 128, as contained within substrate 120, operates as antenna area 129 to transmit and receive RF signals for electrical components **130*a*-130*c*. Electrical components 130*a*-130*c* are electrically connected to antenna area 129 by way of the vertical and horizontal segments of conductive layers 123 and 125**.

In FIG. 2*b*, a plurality of electrical components **130*a*-130*c* is disposed on surface 126 of interconnect substrate 120 to be electrically and mechanically connected to conductive layers 123. Electrical components 130*a*-130*c* are each positioned over substrate 120 using a pick and place operation. For example, electrical component 130*a* and 130*b* can be similar to semiconductor die 104** from FIG. 1*c* with active surface 110 and bumps 114 oriented toward surface 126 of substrate 120. Electrical component **130*c* can be a discrete electrical device, or IPDs, such as a diode, transistor, resistor, capacitor, and inductor, with terminals 134 disposed on surface 126 of interconnect substrate 120 and electrically and mechanically connected to conductive layers 123. Alternatively, electrical components 130***a*-130*c* can include other semiconductor die, semiconductor packages, surface mount devices, discrete electrical devices, or IPDs.

Electrical components 130*a*-130*c* are brought into contact with surface 126 of substrate 120. Bumps 114 are reflowed to mechanically and electrically connect electrical components 130*a*-130*b* to conductive layer 123. Conductive paste 136 bonds electrical component 130*c* to conductive layer 123. FIG. 2*c* shows electrical components 130*a*-130*c* mechanically and electrically connected to conductive layer 123 of interconnect substrate 120.

In FIG. 2*d*, an encapsulant or molding compound 140 is deposited over and around electrical components 130*a*-130*c* and substrate 120 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants.

In FIG. 2*e*, encapsulant or molding compound 144 is deposited over conductive layer 128 and surface 128 of substrate 120 using a paste printing, compressive molding, transfer molding, liquid encapsulant molding, vacuum lamination, spin coating, or other suitable applicator. Encapsulant 144 can be polymer composite material, such as epoxy resin with filler, epoxy acrylate with filler, or polymer with proper filler. Encapsulant 144 is non-conductive, provides structural support, and environmentally protects the semiconductor device from external elements and contaminants. In particular, encapsulant 144 has a greater thickness over conductive layer 128 to form encapsulant blocks 146*a*, 146*b*, 146*c*, and 146*d* over antenna area 129. Encapsulant 144 has a high dielectric constant (Dk) of 13.6-15.2 at 25 GHz and 9.7-11.6 at 28 GHz. FIG. 2*f* is a top view of encapsulant 144 deposited over surface 128 of interconnect substrate 120 and encapsulant blocks 146*a*-146*d* formed over antenna area 129.

Electrical components 130*a*-130*c* may contain IPDs that are susceptible to or generate EMI, RFI, harmonic distortion, and inter-device interference. For example, the IPDs contained within electrical components 130*a*-130*c* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a*-130*c* contain digital circuits switching at a high frequency, which could interfere with the operation of IPDs in the assembly.

To address EMI, RFI, harmonic distortion, and inter-device interference, electromagnetic shielding material 148 is applied over encapsulant 140 and side surface 149 of substrate 120, as shown in FIG. 2*g*. Electromagnetic shielding material 148 can be one or more layers of Al, Cu, Sn, Ni, Au, Ag, or other suitable conductive material. Alternatively, electromagnetic shielding material 148 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

In FIG. 2*h*, electrical connector 150 is mechanically and electrically connected to conductive layer 123 on surface 126 of substrate 120 with bumps or conductive paste, using a pick and place operation similar to FIGS. 2*b*-2*c*. Electrical connector 150 is in electrical communication with electrical components 130*a*-130*c* through conductive layer 172.

In FIG. 2*i*, the assembly is inverted and absorbing sheet or tape 156 is disposed over surface 128 of interconnect substrate 120. Absorbing material 156 has major surface 158 and major surface 160, opposite surface 158. Absorbing sheet 156 has a thickness of 0.356 mm and a plurality of openings 162 sized to accommodate encapsulant blocks 146*a*-146*d*. The thickness of absorbing sheet 156 is less than encapsulant blocks 146*a*-146*d*. Absorbing sheet 156 is made from polymer resin and metal magnetic powder material with an adhesive on surface 160. FIG. 2*j* is a top view of absorbing sheet material 156 with openings 162. FIG. 2*k* is a perspective view of absorbing sheet material 156 with openings 162 disposed over encapsulant blocks 146*a*-146*d*. Absorbing sheet material 156 is flexible and workable to readily bond to encapsulant 144. FIG. 2*l* shows absorbing sheet 156 with the adhesive material on surface 160 bonded to encapsulant 144 and encapsulant blocks 146*a*-146*d* disposed within openings 162. FIG. 2*m* is a top view of absorbing sheet 156 bonded to encapsulant 144 and encapsulant blocks 146*a*-146*d* exposed from openings 162 with a small gap 163 around the encapsulant blocks. FIG. 2*n* is a top view of absorbing sheet 156 bonded to encapsulant 144 and encapsulant blocks 146*a*-146*d* disposed within openings 162 with no gap around the encapsulant blocks, i.e., the absorbing sheet material contacts the encapsulant blocks.

Figure 3:
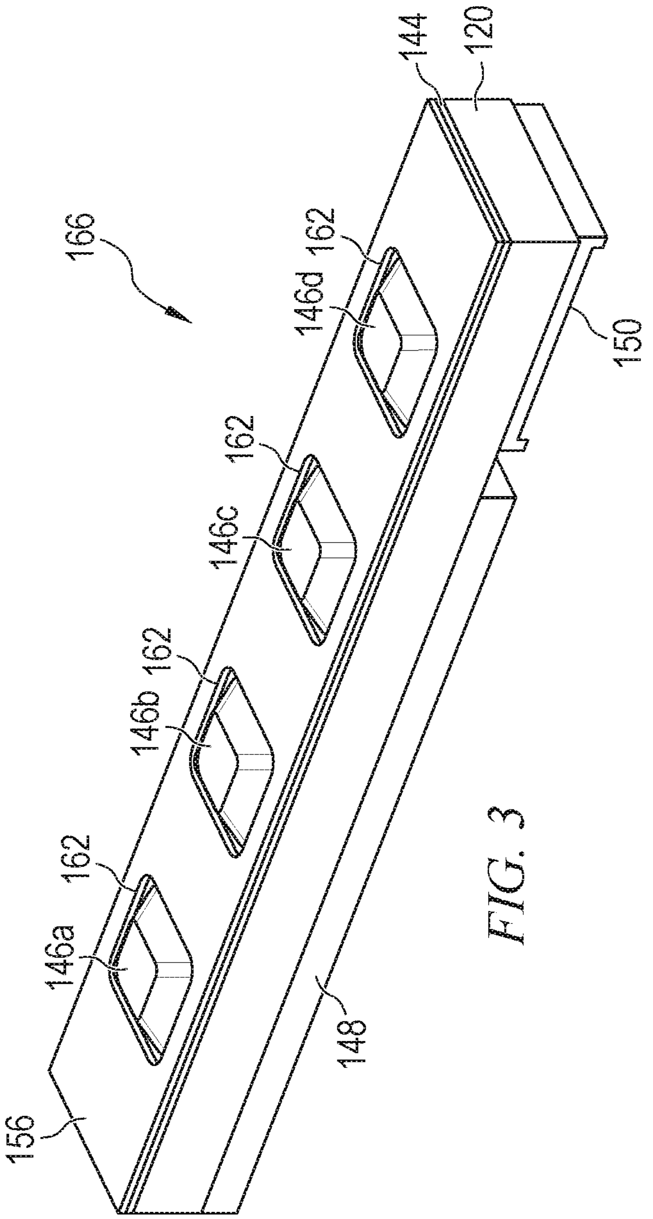
FIG. 3 is a perspective view of the absorbing material disposed over the AiP module.

FIG. 3 is a perspective view of absorbing sheet 156 bonded to encapsulant 144 and encapsulant blocks 146*a*-146*d* disposed within openings 162. The combination of interconnect substrate 120, electrical components 130*a*-130*c*, encapsulant 140, antenna area 129, encapsulant 144, encapsulant blocks 146*a*-146*d* over antenna area 129, shielding material 148, electrical connector 150, and absorbing sheet 156 constitute collectively antenna-in-package (AiP) 166.

AiP 166 is appliable to mobile electrical devices, such as 5G phones, as well as other portable multimedia devices. AiP 166 is useful for high functionality devices having a high level of integration, large interface pin-count with associated reduced interface pitches, all in a package with reduced thickness.

Figure 4A:
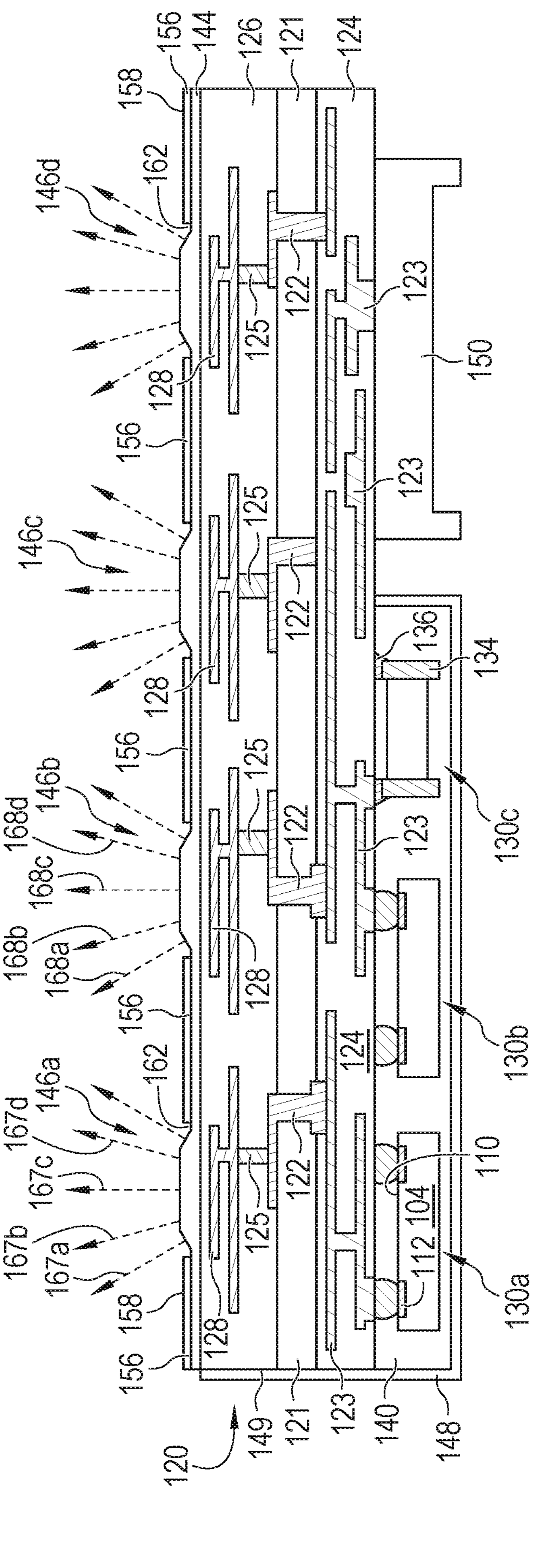
FIGS. 4*a*-4*b* illustrate reduced signal interference using the absorbing material over the AiP module.
Figure 4B:
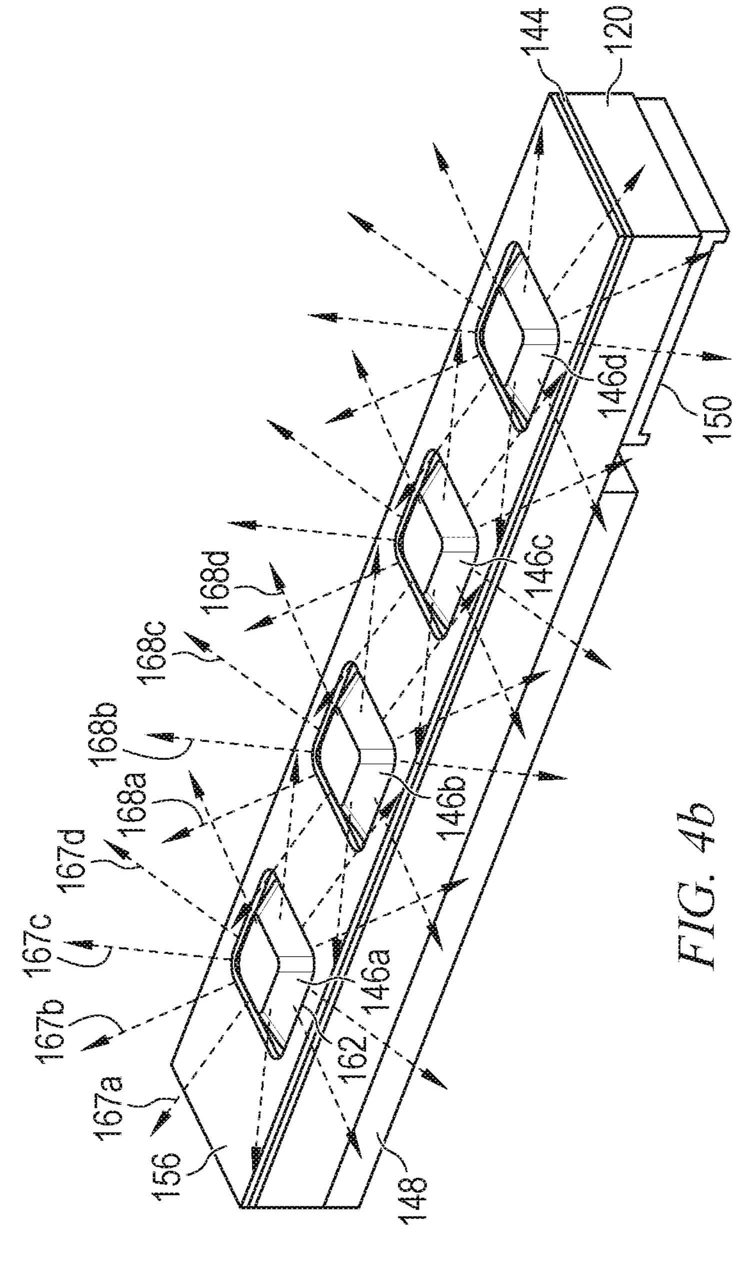

As described in the background, AiP devices can emit radiation in the microwave frequency range, conduct surface currents, and exhibit surface reflections in a cavity resonance. In AiP 166, absorbing sheet 156 suppresses radiation interference in the microwave frequency range and reduces surface currents, as well as surface reflections from a cavity resonance, due to its absorbing material. FIG. 4*a* shows radiation emission waves 167*a*-167*d* and 168*a*-168*d*, but the waves have reduced interference. For example, wave 167*a* exhibits reduced or minimal radiation interference with waves 167*b*, 167*c*, and 167*d* for encapsulant block 146*a*. Likewise for waves 167*b*-167*d*, respectively. Wave 168*a* exhibits reduced or minimal radiation interference with waves 168*b*, 168*c*, and 168*d* for encapsulant block 146*b*. Likewise for waves 168*b*-168*d*, respectively. Waves 167*a*-167*d* exhibit reduced or minimal interferences with waves 168*a*-168*d* with absorbing material 156. Encapsulant blocks 146*c*-146*d* with absorbing material 156 would have similar non-interfering radiation emission waves like 167*a*-167*d* and 168*a*-168*d*. Absorbing material 156 absorbs and suppresses radiation interference, particularly around the edges of encapsulant blocks 146*a*-164*d*. FIG. 4*b* illustrates a perspective view of waves 167*a*-167*d* from encapsulant block 146*a* with absorbing material 156 exhibiting reduced or minimal radiation interferences with waves 168*a*-168*d* from encapsulant block 146*b* with absorbing material 156. AiP 166 with absorbing material 156 reduces or minimizes radiation emission interference among and between the plurality of encapsulant blocks 146*a*-146*d*, particularly for high frequency applications such as 5G devices. Absorbing sheet 156 reduces or minimizes radiation interference among and between encapsulant blocks 146*a*-146*d* by nature of the absorbing material.

Figure 5A:
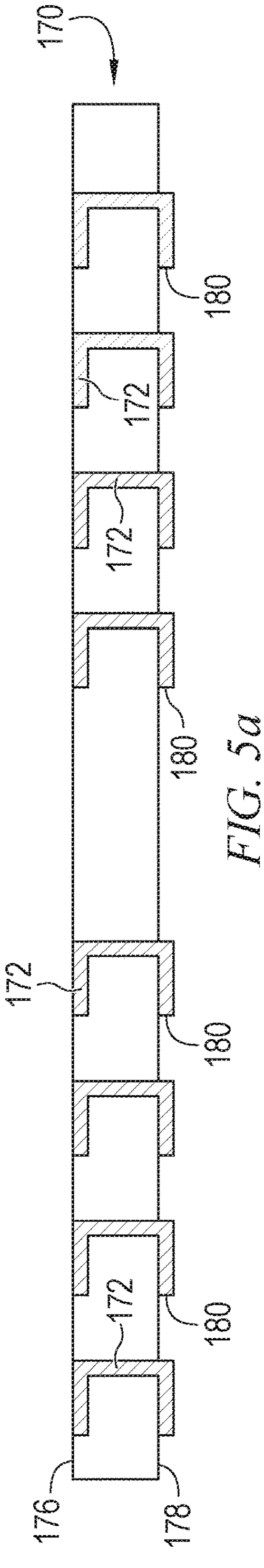
FIGS. 5*a*-5*g* illustrate another process of forming an AiP module with absorbing material disposed over the AiP module.

In another embodiment, a cross-sectional view of interconnect substrate 170 is shown including conductive layers 172 and insulating layer 174, as in FIG. 5*a*. Conductive layer 172 can be one or more layers of Al, Cu, Sn, Ni, Au, Ag, or other suitable electrically conductive material. Conductive layers 172 can be formed using PVD, CVD, electrolytic plating, electroless plating process, or other suitable metal deposition process. Conductive layer 172 provides horizontal electrical interconnect across substrate 170 and vertical electrical interconnect between top surface 176 and bottom surface 178 of substrate 170. Portions of conductive layer 172 can be electrically common or electrically isolated depending on the design and function of electrical components 130*a*-130*c*. Insulating layer 174 contains one or more layers of SiO2, Si3N4, SiON, Ta2O5, Al2O3, solder resist, prepreg, polyimide, polymer, BCB, PBO, and other material having similar insulating and structural properties. Insulating layers 174 can be formed using PVD, CVD, printing, lamination, spin coating, spray coating, sintering or thermal oxidation. Insulating layer 174 provides isolation between conductive layers 172. There can be multiple conductive layers like 172 separated by multiple insulating layers like 174.

Conductive layer 180 is formed over surface 178 of substrate 170 and electrically connected to conductive layer 172. Conductive layer 180 can be one or more layers of Al, Cu, Sn, Ni, Au, Ag, or other suitable electrically conductive material.

Figure 5B:
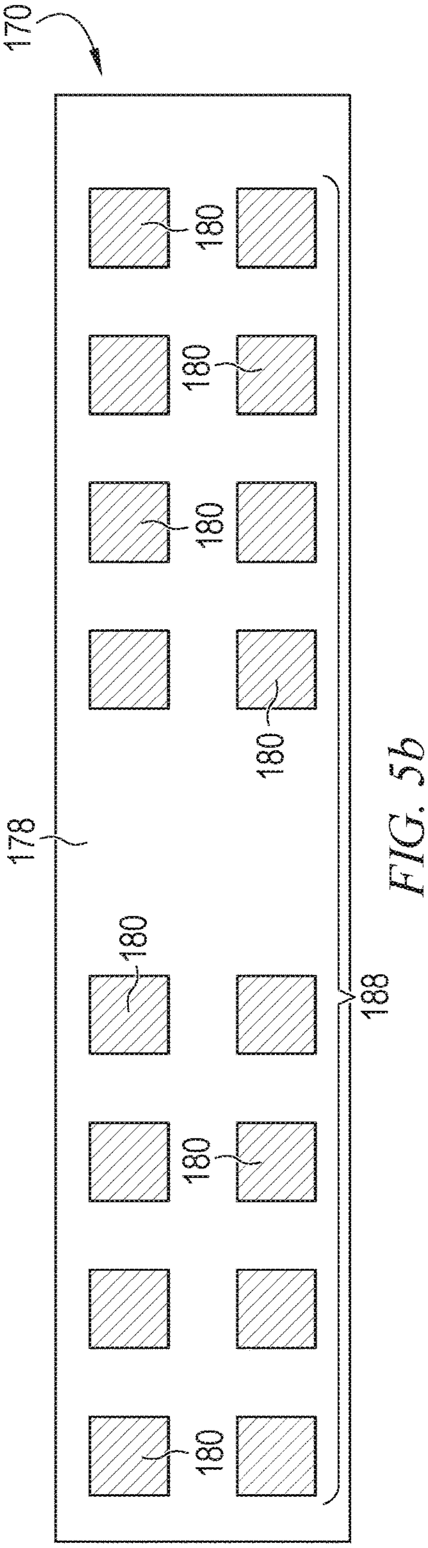

FIG. 5*b* is a top view of conductive layer 180 on surface 178 of interposer substrate 170. Conductive layer 180 includes an array of islands of conductive material 188 suitable to provide transmission and reception of RF signals, i.e., an RF antenna. In particular, the array of islands 188 of conductive layer 180 is exposed from surface 178 to improve RF transmission and reception performance and quality.

Figure 5C:
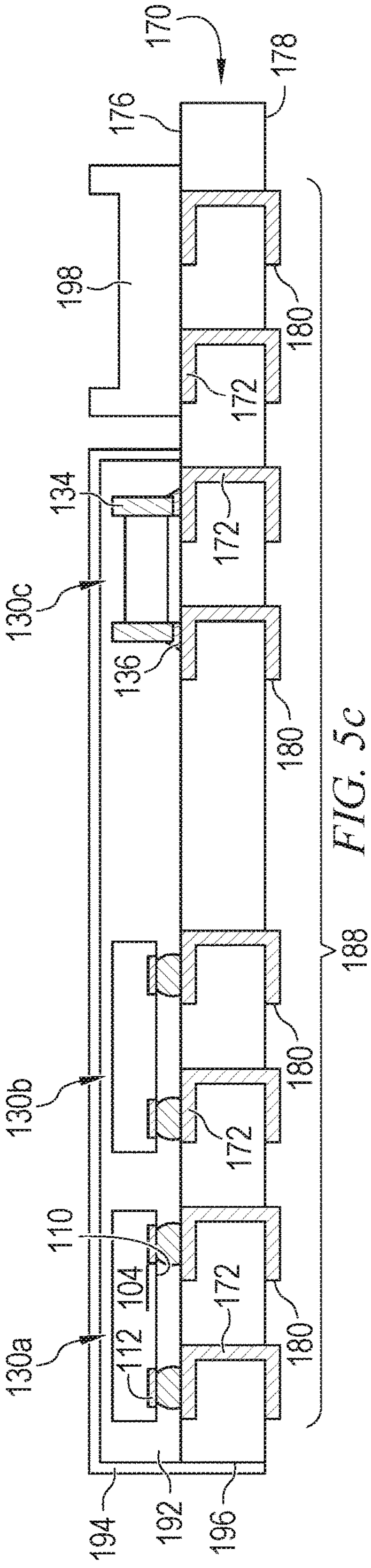

In FIG. 5*c*, a plurality of electrical components 130*a*-130*c* is disposed on surface 176 of interconnect substrate 170 and mechanically connected to conductive layers 172 using a pick and place operation, similar to FIGS. 2*b*-2*c*. Elements having a similar function are assigned the same reference number in the figures.

An encapsulant or molding compound 192 is deposited over and around electrical components 130*a*-130*c* on substrate 170 using a paste printing, compressive molding, transfer molding, liquid encapsulant molding, vacuum lamination, spin coating, or other suitable applicator. Encapsulant 192 can be polymer composite material, such as epoxy resin with filler, epoxy acrylate with filler, or polymer with proper filler. Encapsulant 192 is non-conductive, provides structural support, and environmentally protects the semiconductor device from external elements and contaminants.

To address EMI, RFI, harmonic distortion, and inter-device interference, electromagnetic shielding material 194 is applied over encapsulant 192 and side surface 196 of substrate 170. Electromagnetic shielding material 194 can be one or more layers of Al, Cu, Sn, Ni, Au, Ag, or other suitable conductive material. Alternatively, electromagnetic shielding material 196 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

Electrical connector 198 is mechanically and electrically connected to conductive layer 172 of substrate 170 with bumps or conductive paste, using a pick and place operation similar to FIGS. 2*b*-2*c*. Electrical connector 198 is electrically connected through conductive layer 172 to electrical components 130*a*-130*c*.

Figures 5D, 5E, 5F:
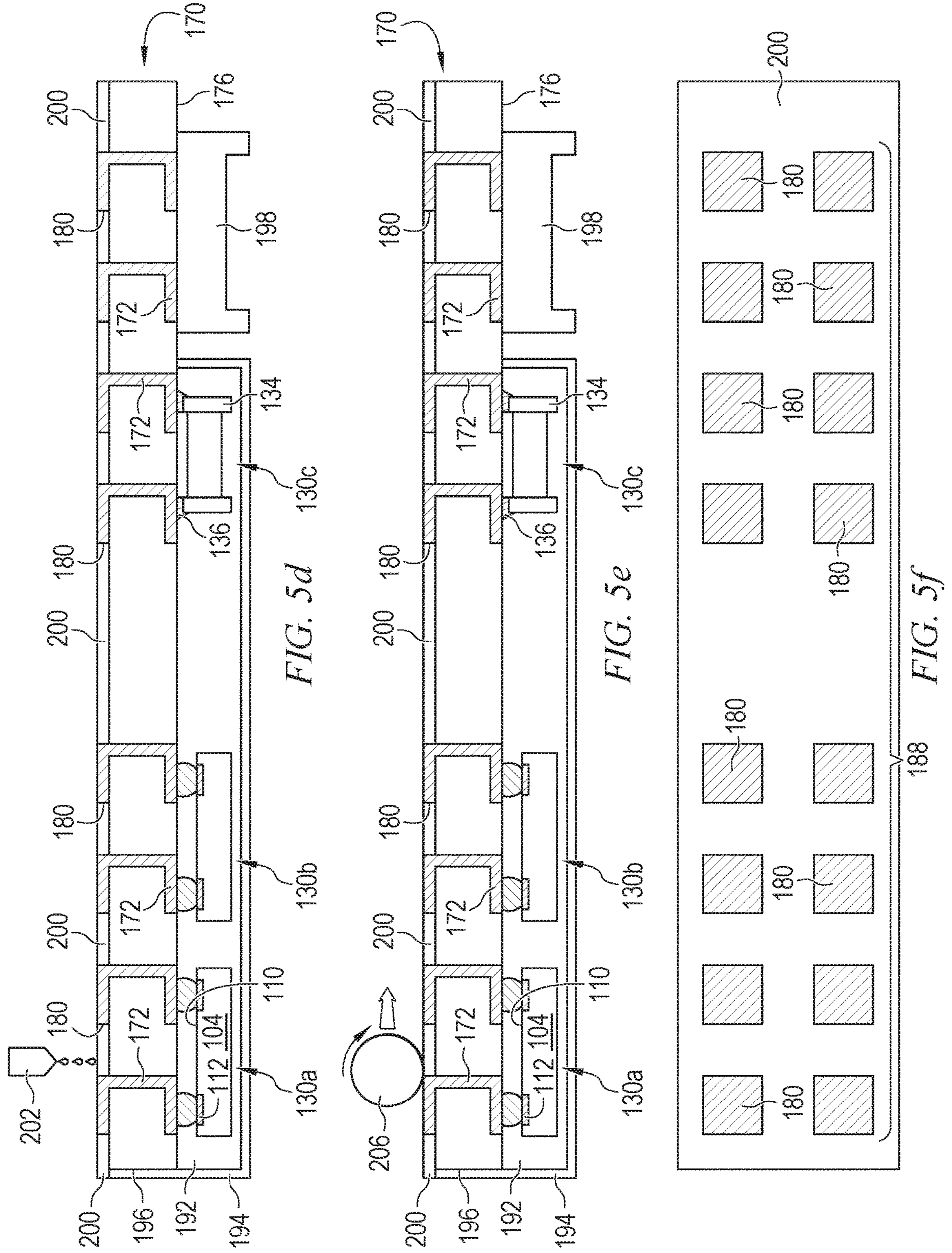

In FIG. 5*d*, the assembly is inverted and absorbing material 200 is deposited on surface 178 of substrate 170 using dispenser 202. Absorbing material 200 is made from liquid, low viscosity, or pliable polymer resin and metal magnetic powder material to readily distribute the absorbing material across surface 178. In FIG. 5*e*, absorbing material 200 is rolled out or planarized with roller 206 to expose antenna islands 188, and then cured. Absorbing material 200 is flexible and workable to readily bond to surface 178. FIG. 5*f* is a top view of absorbing material 200, as bonded to surface 178, with antenna array 188 exposed from the absorbing material.

Figure 5G:
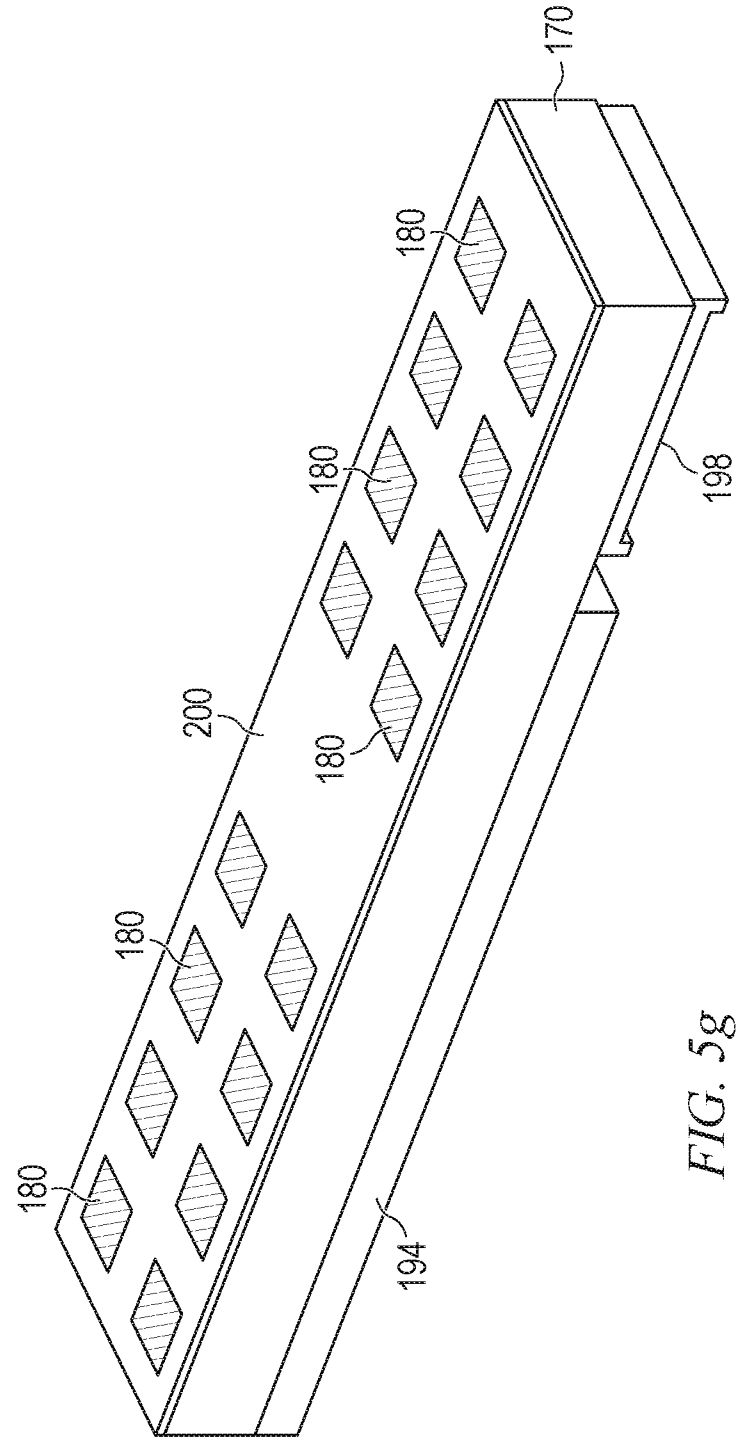

FIG. 5*g* of perspective view of absorbing material 200 bonded to surface 178 and antenna array 188 exposed from the absorbing material. The combination of interconnect substrate 170, electrical components 130*a*-130*c*, encapsulant 192, antenna islands 188, shielding material 194, electrical connector 198, and absorbing material 200 constitute Aip 210.

As described in the background, AiP devices can emit radiation in the microwave frequency range, conduct surface currents, and exhibit surface reflections in a cavity resonance. In AiP 210, absorbing material 200 suppresses radiation interference in the microwave frequency range and reduces surface currents, as well as surface reflections from a cavity resonance, due to its absorbing material, similar to FIGS. 4*a*-4*b*.

Figure 6:
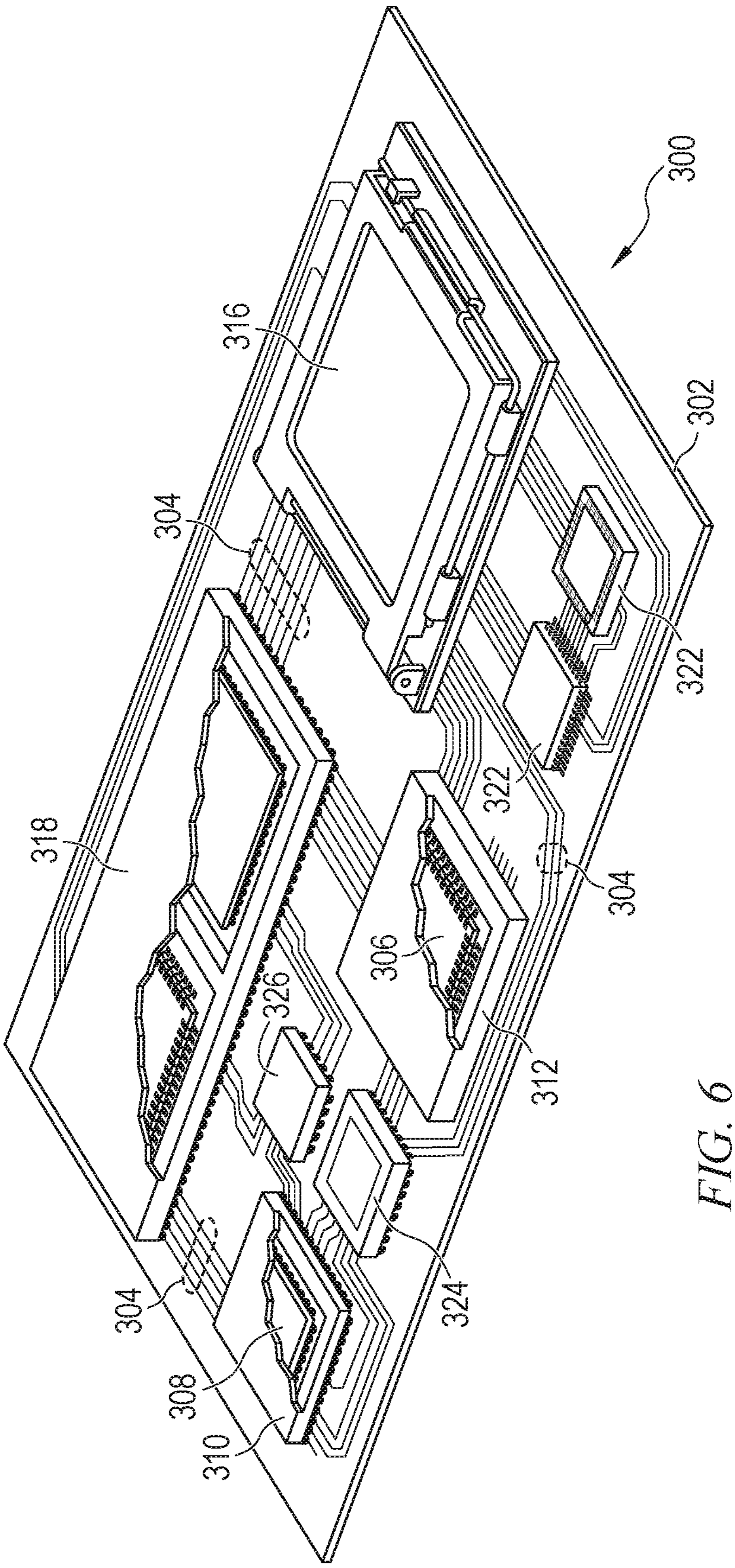
FIG. 6 illustrates a printed circuit board (PCB) with different types of packages disposed on a surface of the PCB.

FIG. 6 illustrates electronic device 300 having a chip carrier substrate or PCB 302 with a plurality of semiconductor packages disposed on a surface of PCB 302, including AiP 166 and AiP 210 with absorbing material. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 6, PCB 302 provides a general substrate for structural support and electrical interconnect of the semiconductor packages disposed on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown disposed on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electrical components, can be connected to PCB 302. In some embodiments, electrical device 300 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:

a substrate including an antenna portion of the substrate;

an electrical component disposed over a first surface of the substrate;

a first encapsulant deposited over a second surface of the substrate opposite the first surface of the substrate, wherein the first encapsulant includes a first surface and an encapsulant block disposed over the antenna portion of the substrate and extending above the first surface of the first encapsulant; and an absorbing material disposed over a surface of the first encapsulant opposite the substrate with the encapsulant block extending through an opening in the absorbing material.

2. The semiconductor device of claim 1, wherein the encapsulant block extends through the opening above the absorbing material.

3. The semiconductor device of claim 1, further including a plurality of openings in the absorbing material to accommodate a plurality of encapsulant blocks of the first encapsulant.

4. The semiconductor device of claim 1, further including:

a second encapsulant deposited over the electrical component; and a shielding material disposed over the second encapsulant and electrical component.

5. The semiconductor device of claim 1, further including an electrical connector disposed over the first surface of the substrate.

6. A semiconductor device, comprising:

an antenna-on-package including an encapsulant block formed over an antenna portion of the antenna-on-package; and an absorbing material disposed over an external surface of the antenna-on-package with the encapsulant block extending through an opening in the absorbing material.

7. The semiconductor device of claim 6, wherein the antenna-on-package includes:

a substrate including an antenna portion of the substrate;

an electrical component disposed over a first surface of the substrate;

a first encapsulant deposited over a second surface of the substrate opposite the first surface of the substrate and including the encapsulant block disposed over the antenna portion of the substrate; and the absorbing material being disposed over the first encapsulant.

8. The semiconductor device of claim 7, wherein the encapsulant block extends through the opening in the absorbing material.

9. The semiconductor device of claim 8, wherein the encapsulant block extends through the opening above the absorbing material.

10. The semiconductor device of claim 8, further including a plurality of openings in the absorbing material to accommodate a plurality of encapsulant blocks of the first encapsulant.

11. The semiconductor device of claim 7, further including:

a second encapsulant deposited over the electrical component; and a shielding material disposed over the second encapsulant and electrical component.

12. The semiconductor device of claim 7, further including an electrical connector disposed over the first surface of the substrate.

13. A method of making a semiconductor device, comprising:

providing a substrate including an antenna portion of the substrate;

disposing an electrical component over a first surface of the substrate;

depositing a first encapsulant over a second surface of the substrate opposite the first surface of the substrate, wherein the first encapsulant includes a first surface and an encapsulant block disposed over the antenna portion of the substrate and extending above the first surface of the first encapsulant; and disposing an absorbing material over a surface of the first encapsulant opposite the substrate with the encapsulant block extending through an opening in the absorbing material.

14. The method of claim 13, wherein the encapsulant block extends above the absorbing material.

15. The method of claim 13, further including forming a plurality of openings in the absorbing material to accommodate a plurality of encapsulant blocks of the first encapsulant.

16. The method of claim 13, further including:

depositing a second encapsulant over the electrical component; and disposing a shielding material over the second encapsulant and electrical component.

17. The method of claim 13, further including disposing an electrical connector over the first surface of the substrate.

18. A method of making a semiconductor device, comprising:

providing an antenna-on-package including an encapsulant block formed over an antenna portion of the antenna-on-package; and disposing an absorbing material over an external surface of the antenna-on-package with the encapsulant block extending through an opening in the absorbing material.

19. The method of claim 18, wherein providing the antenna-on-package includes:

providing a substrate including an antenna portion of the substrate;

disposing an electrical component over a first surface of the substrate;

depositing a first encapsulant over a second surface of the substrate opposite the first surface of the substrate and including the encapsulant block disposed over the antenna portion of the substrate; and disposing the absorbing material over the first encapsulant.

20. The method of claim 19, wherein the first encapsulant includes a first surface and the encapsulant block disposed over the antenna portion of the substrate extends above the first surface of the first encapsulant.

21. The method of claim 19, further including forming a plurality of openings in the absorbing material to accommodate a plurality of encapsulant blocks of the first encapsulant.

22. The method of claim 19, further including:

depositing a second encapsulant over the electrical component; and disposing a shielding material over the second encapsulant and electrical component.

23. The method of claim 19, further including disposing an electrical connector over the first surface of the substrate.

* * * * *